United States Patent
Shang et al.

(10) Patent No.: US 10,678,317 B2
(45) Date of Patent: Jun. 9, 2020

(54) POWER SUPPLY CONTROL DEVICE AND OPERATING METHOD USING THE SAME

(71) Applicant: Wistron Corporation, New Taipei (TW)

(72) Inventors: Mei-Ling Shang, New Taipei (TW); Wei Liang Liao, New Taipei (TW); Kai-Cheng Lee, New Taipei (TW); Ke Yang, New Taipei (TW); Jia Sheng Huang, New Taipei (TW); Hua Yue Li, New Taipei (TW)

(73) Assignee: Wistron Corporation, New Taipei (TW)

( * ) Notice: Subject to any disclaimer, the term of this patent is extended or adjusted under 35 U.S.C. 154(b) by 188 days.

(21) Appl. No.: 16/053,780

(22) Filed: Aug. 2, 2018

(65) Prior Publication Data

US 2019/0369690 A1 Dec. 5, 2019

(30) Foreign Application Priority Data

Jun. 5, 2018 (CN) .......................... 2018 1 0575414

(51) Int. Cl.
*G06F 1/28* (2006.01)
*H05K 5/02* (2006.01)
*G06F 1/3231* (2019.01)
*H03K 17/96* (2006.01)

(52) U.S. Cl.
CPC .............. *G06F 1/28* (2013.01); *G06F 1/3231* (2013.01); *H03K 17/96* (2013.01); *H05K 5/0217* (2013.01)

(58) Field of Classification Search
CPC ......... G06F 1/28; G06F 1/3231; H03K 17/96; H05K 5/0217
See application file for complete search history.

(56) References Cited

U.S. PATENT DOCUMENTS

2017/0336970 A1    11/2017    Kim

FOREIGN PATENT DOCUMENTS

TW            200926543           6/2009

*Primary Examiner* — Robert L Deberadinis
(74) *Attorney, Agent, or Firm* — Winston Hsu

(57) ABSTRACT

A power supply control device, applied for an electronic device is disclosed. The electronic device includes a case, wherein a user holds the case to operate the electronic device. The power supply control device includes a sensing module, including a first sensing component for sensing whether the user is touching a first sensing area of the case to generate a first determination signal; and a second sensing component for sensing whether the user is touching a second sensing area of the case to generate a second determination signal; and a power supply module, including a first relay, for connecting or disconnecting a system power end of the electronic device from a power supply terminal according to the first determination signal; and a second relay, for connecting or disconnecting a system ground end of the electronic device from a ground terminal according to the second determination signal.

12 Claims, 4 Drawing Sheets

POWER SUPPLY CONTROL DEVICE AND OPERATING METHOD USING THE SAME

BACKGROUND OF THE INVENTION

1. Field of the Invention

The present invention relates to a power supply control device and operating method using the same, and more particularly, to a power supply control device and operating method capable of sensing touches of the user to conduct a power supply of an electronic device.

2. Description of the Prior Art

When operating a conventional electronic device, a user may turn a power supply of the electronic device on or off to control the electronic device depending on demand of the user. Notably, when the user neglects and leaves the power supply of the electronic device on, unnecessary power is consumed or the electronic device may be damaged, and even worse, it may result in safety concerns of the user.

Furthermore, when the electronic device is a remote control electronic device and the user is using a controller of the electronic device to remotely control the electronic device, the user has to pass a distance between the controller and a power supply of the electronic device to turn on the power of the electronic device. Thus, causing inconveniences to the user and lowering expectation of the user to turn off the power of the electronic device through a standard procedure. Under such a circumstance, if the user carelessly touches the controller, unnecessary power is consumed or the user or others may be harmed.

Therefore, there is necessity to improve over the prior art.

SUMMARY OF THE INVENTION

It is therefore a primary objective of the present invention to provide a power supply control device and operating method using the same capable of avoiding unnecessary power consumption and protecting the user.

The present invention provides a power supply control device, applied for an electronic device comprising a case provided for a user to hold and operate the electronic device. The power supply control device comprises a sensing module, disposed on the case, comprising a first sensing component, disposed on a first sensing area of the case, for sensing whether the user is touching the first sensing area, to generate a first determination signal; and a second sensing component, disposed on a second sensing area of the case different to the first sensing area, for sensing whether the user is touching the second sensing area, to generate a second determination signal; and a power supply module, comprising a first relay, coupled to the first sensing component, a system power end of the electronic device and a power supply terminal, for determining whether to couple the system power end to the power supply terminal according to the first determination signal; and a second relay, coupled to the second sensing component, a system ground end of the electronic device and a ground terminal, for determining whether to couple the system ground end to the ground terminal according to the second determination signal.

The present invention further provides an operating method, applied for an electronic device, wherein a user holds a case of the electronic device to operate the electronic device. The operating method comprises sensing whether the user is touching a first sensing area and a second sensing area on the case, to generate a first determination signal corresponding to the first sensing area and a second determination signal corresponding to the second sensing area; and determining whether to couple a system power end of the electronic device to a power supply terminal according to the first determination signal, and determining whether to couple a system ground end of the electronic device to a ground terminal according to the second determination signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used in the following description and claims to refer to particular components. Those skilled in the art will appreciate, manufacturers may use different terms to refer to a component. This document does not intend to follow the difference component distinguished name as a way to differentiate components but functionally distinguished as a criterion. Mentioned in the following description and claims the terms "include" or "comprising" is an open-ended fashion, and thus should be interpreted to mean "including/include but not limited to." Except, "coupled" are intended to mean either an indirect or direct electrical connection. Accordingly, described herein if a device is coupled to a second device, said first means represents may be directly electrically connected to said second means, or by connecting to other devices or indirectly electrically connected to said first means second means.

Figure 1:
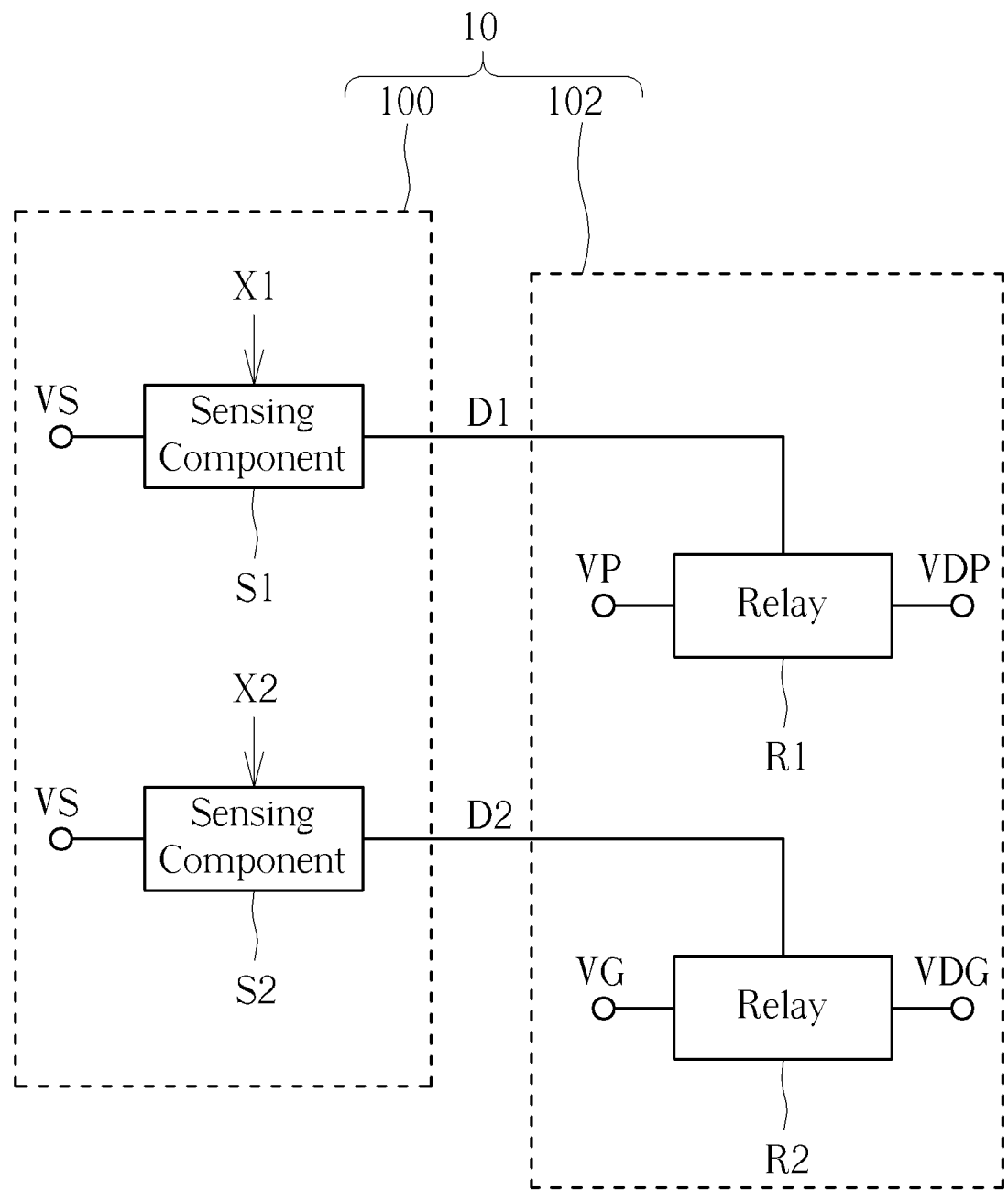
FIG. 1 is a schematic diagram of a power supply control device according to an embodiment of the present invention.

Please refer to FIG. 1, which is a schematic diagram of a power supply control device 10 according to an embodiment of the present invention. The power supply control device 10 is utilized for an electronic device comprising a case, wherein the case may be grabbed or held by a user to operate the electronic device. For example, the electronic device may be a heat gun and a rework station, and the case may be a case of the heat gun for the user to hold and operate. The power supply control device 10 is utilized for sensing and determining whether the user is holding or touching the electronic device, to turn the power of the electronic device on or off. As such, the power supply control device 10 may turn on the power of the electronic device when the user is holding or touching the electronic device, or turn off the power of the electronic device when the user is not holding or touching the electronic device, to avoid unnecessary power consumption and protect the user.

As shown in FIG. 1, the power supply control device 10 comprises a sensing module 100 and a power supply module 102. The sensing module 100 comprises sensing components S1, S2, respectively disposed on different sensing areas of the case, and utilized for sensing whether the user is touching the electronic device, to respectively generate determination signals D1, D2. The power supply module 102 comprises relays R1, R2, wherein the relay R1 is coupled to the sensing component S1 and the relay R2 is coupled to the sensing component S2. The relays R1, R2 are respectively utilized for selectively turning the power of the electronic device on or off according to the determination signals D1, D2.

In one embodiment, the sensing component S1 is a touch switch, wherein one end of the sensing component S1 is coupled to a voltage source VS (e.g. 3.3V) and another end is coupled to the relay R1. When the user is touching the corresponding sensing area on the case, the sensing component S1 may receive a sensing signal X1 generated by touch of the user, for conducting a connection between two ends of the sensing component S1, to deliver a voltage of the voltage source VS to the relay R1. In the same way, the sensing component S2 may be a touch switch as well, wherein one end of the sensing component S2 is coupled to the voltage source VS and another end is coupled to the relay R2. When the user is touching the corresponding sensing area on the case, the sensing component S2 may receive a sensing signal X2 generated by touch of the user, for conducting a connection between two ends of the sensing component S2, to deliver the voltage of the voltage source VS to the relay R2. Notably, as long as the sensing components S1, S2 can sense touches of the user on different sensing areas to generate the determination signals D1, D2, the sensing components are within the scope of the present invention. According to different applications and design concepts, the sensing components S1, S2 may preferably be implemented by a capacitive sensor, a resistive sensor or an optical sensor, and the sensing signals X1, X2 may be pressure signals, capacitance signals, current signals or light signals, and are not limited herein.

In addition, the relay R1 is coupled to a power supply terminal VP, a system power end VDP of the electronic device and the sensing component S1. The relay R1 may selectively connect the power supply terminal VP to the system power end VDP of the electronic device, or disconnect the power supply terminal VP from the system power end VDP of the electronic device according to the determination signal D1. In this embodiment, when a voltage level of the determination signal D1 is at high voltage level (i.e. 3.3V), it indicates that the user is touching the corresponding sensing area on the case, such that the relay R1 connects the power supply terminal VP to the system power end VDP of the electronic device; when the voltage level of the determination signal D1 is at low voltage level (i.e. 0V), it indicates that the user is not touching the case, such that the relay R1 disconnects the power supply terminal VP from the system power end VDP of electronic device. Moreover, the relay R2 is coupled to a ground terminal VG, a system ground end VDG of the electronic device and the sensing component S2. When a voltage level of the determination signal D2 is at high voltage level (i.e. 3.3V), it indicates that the user is touching the corresponding sensing area on the case, such that the relay R2 connects the ground terminal VG to the system ground end VDG of electronic device; when the voltage level of the determination signal D2 is at low voltage level (i.e. 0V), it indicates that the user is not touching the case, such that the relay R2 disconnects the ground terminal VG from the system ground end VDG of the electronic device.

In brief, the relay R1 may conduct the connection between the power supply terminal VP and the system power end VDP according to the determination signal D1, and the relay R2 may conduct the connection between the ground terminal VG and the system ground end VDG according to the determination signal D2. When only one of the determination signals D1, D2 is indicating that the user is touching the case, the system power end VDP and the system ground end VDG of the electronic device are not conducted at the same time, such that the user may not operate the electronic device. Only when both of the determination signals D1, D2 are indicating that the user is touching the case, the system power end VDP and the system ground end VDG of the electronic device are conducted at the same time, such that the user may operate the electronic device. As such, the present invention may avoid turning on the electronic device by careless touch of the user on the sensing components S1, S2. If one of the determination signals D1, D2 is indicating that the user is touching the case, the power supply control device 10 of the present invention will not turn on the electronic device, and the electronic device will not be turned on by careless touch of the user. Therefore, the power supply control device 10 of the present invention may avoid unnecessary power consumption and protect the user.

In this embodiment, one end of the sensing component S1 or S2 is coupled to the voltage source VS of 3.3V, for respectively generating the determination signal D1 and the determination signal D2 when the user is touching the case. However, not limited herein, voltage of the voltage source VS of the present invention may be within 0V-36V, as long as the voltage of the voltage source VS is within a safety range for a human body, and the determination signals D1, D2 may be generated.

In addition, the power supply control device of the present invention may be detachedly disposed on the electronic device. In other words, the determination signals D1, D2 may be transmitted between the sensing module and the power supply module through a wireless transmission method, such that design of the sensing module and the power supply module of the present invention may be more flexible.

Figure 2:
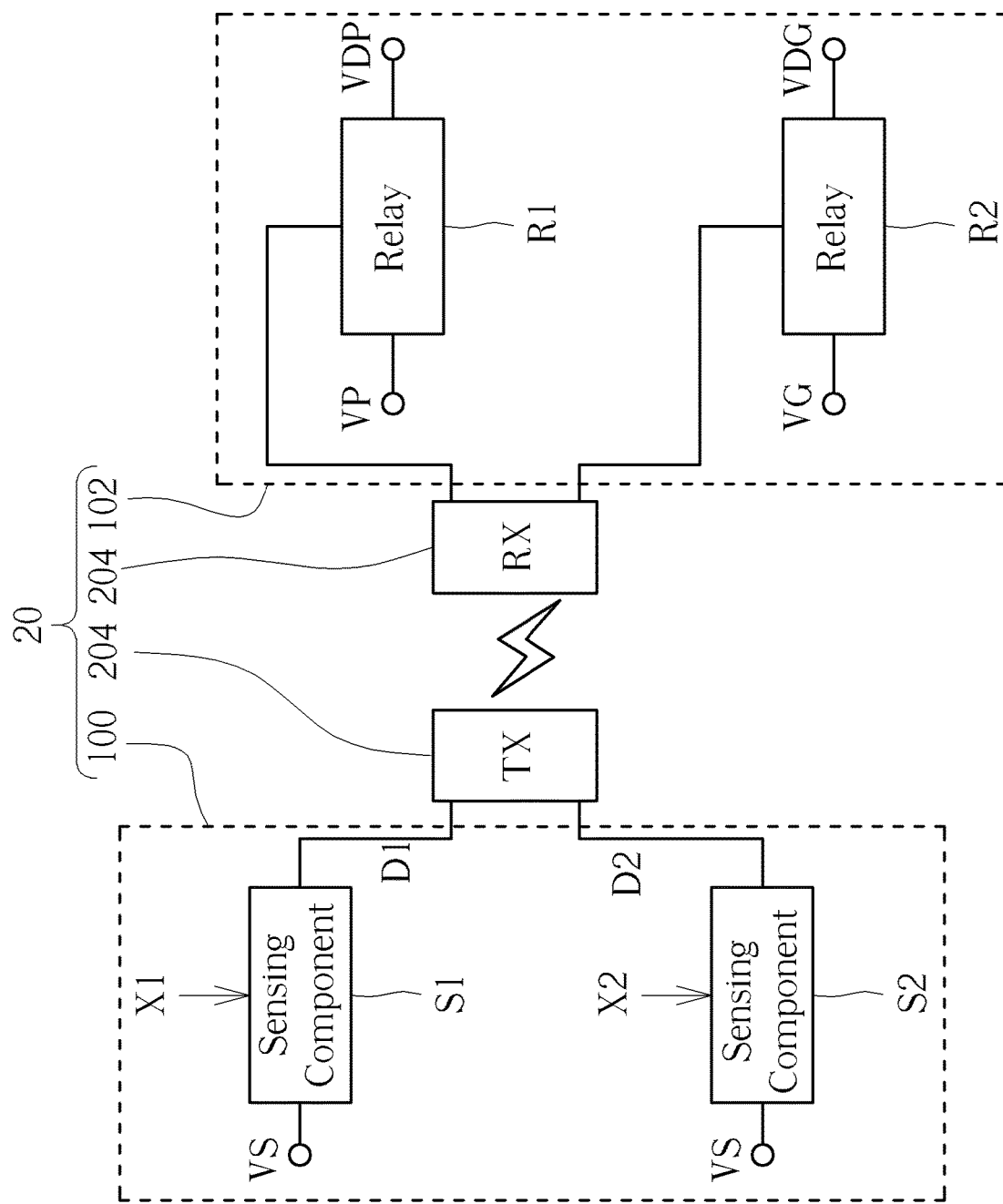
FIG. 2 is a schematic diagram of another power supply control device according to an embodiment of the present invention.

Please refer to FIG. 2, which is a schematic diagram of another power supply control device 20 according to an embodiment of the present invention. The power supply control device 20 is similar to the power supply control device 10, and thus, the same components are denoted by the same symbols. Notably, the power supply control device 20 further comprises a wireless transmission module 204, coupled to the sensing module 100 and the power supply module 102, utilized for transmitting the determination signals D1, D2.

In detail, the wireless transmission module 204 comprises a transmitter TX and a receiver RX, wherein the transmitter TX and the receiver RX are respectively coupled to the sensing module 100 and the power supply module 102. The transmitter TX is coupled to the sensing components S1, S2 of the sensing module 100, for receiving the determination signals D1, D2 and delivering them by the wireless transmission method. For example, the transmitter TX may transmit the determination signals D1, D2 to the receiver RX through Bluetooth, Wi-Fi, infrared signals or other types of wireless signals. The receiver RX is coupled to the relays R1, R2, for receiving the determination signals D1, D2 delivered by the transmitter TX so as to instruct the relays R1, R2. Under such a circumstance, the power supply control device 20 may determine whether the user needs to use the electronic device according to the sensing signals X1, X2 generated by touches of the user on different sensing areas, and deliver the determination signals D1, D2 via the wireless transmission module 204 by the wireless transmission method. As such, the power supply control device 20 may properly turn the power of the electronic device on or off, to avoid unnecessary power consumption and protect the user, while improving convenience of the user.

Figure 3:
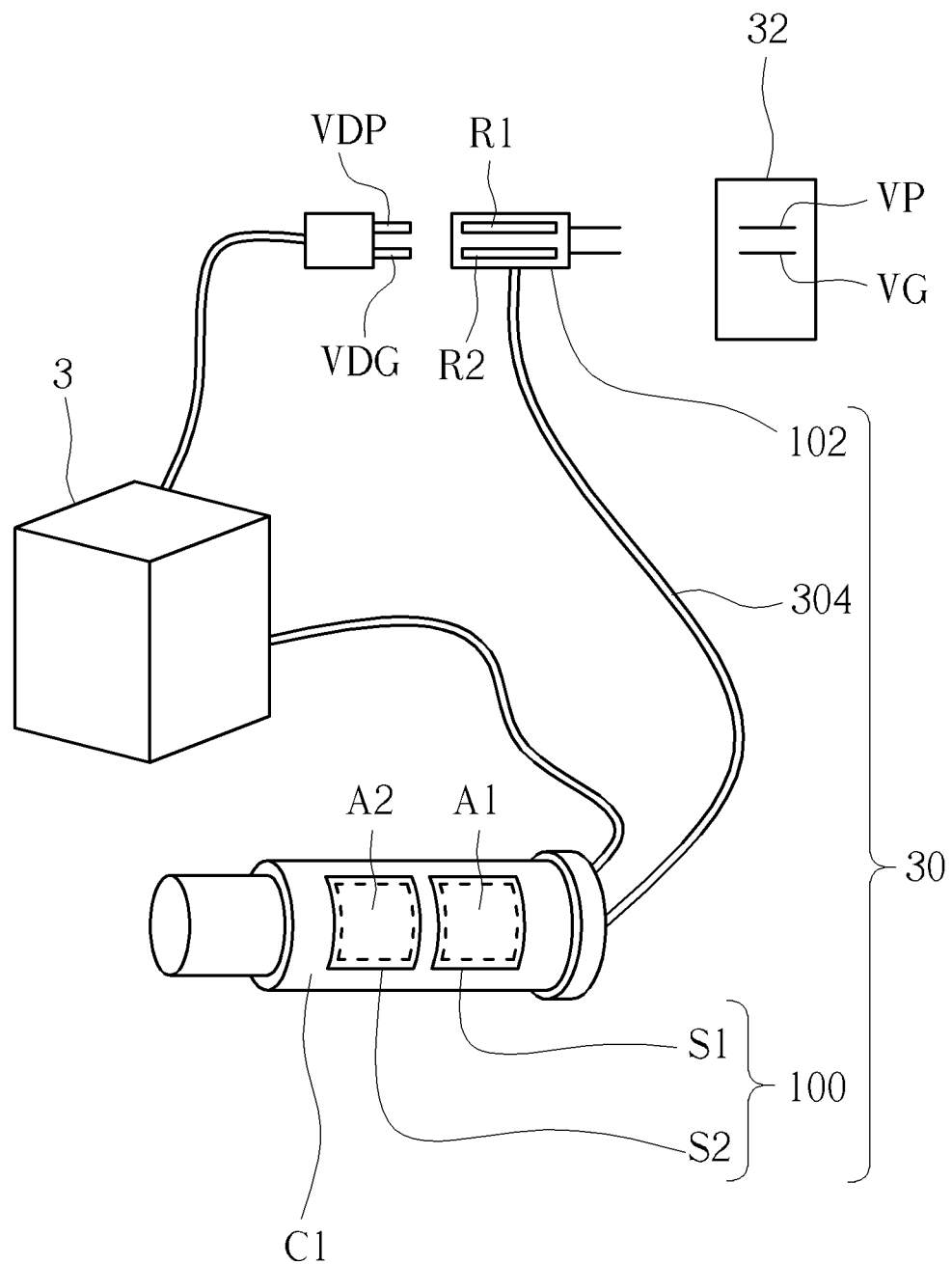
FIG. 3 is a schematic diagram of a power supply control device being disposed on an electronic device according to an embodiment of the present invention.

About detailed procedures of how the power supply control devices 10, 20 are applied to the electronic device, please refer to FIG. 3. FIG. 3 is a schematic diagram of a power supply control device 30 being disposed on an electronic device 3 according to an embodiment of the present invention. The power supply control device 30 is similar to the power supply control device 10, and thus, the same components are denoted by the same symbols. In such an embodiment, the electronic device 3 is a heat gun station, which comprises a case C1 for the user to hold and operate the electronic device 3, and is utilized for heating a welding part of a targeted electronic component for desoldering in order to disassemble its welding structure. The sensing module 100 is disposed on the case C1. The sensing components S1, S2 of the sensing module 100 may respectively sense the sensing signals X1, X2 generated by touches of the user on the sensing areas A1, A2 of the case C1, so as to operate the electronic device 3. In such an embodiment, a socket 32 comprises the power supply terminal VP and the ground terminal VG, and the system power end VDP and the system ground end VDG of the electronic device 3 are respectively coupled to the power supply terminal VP and the ground terminal VG through the relays R1, R2 of the power supply module 102. Notably, the sensing module 100 and the power supply module 102 are connected through a transmission module 304. The transmission module 304 may be the embodiment depicted in FIG. 1, which connects and delivers the determination signals D1, D2 through a physical transmission line. Otherwise, the transmission module 304 may be the embodiment depicted in FIG. 2, which connects and delivers the determination signals D1, D2 through the wireless transmission method. As such, the power supply module 102 may conduct the connections between the electronic device 3 and the socket 32 according to the determination signals D1, D2 delivered by the sensing module 100. Specifically, under such a circumstance that the user intends to operate the electronic device 3 to disassemble the targeted electronic component and leaving the operation scene of the electronic device 3 without turning off the power of electronic device 3, constantly-heated temperature may damage the targeted electronic component for desoldering and the electronic device 3, causing unnecessary power consumption and risk of harming the user if the user intends to hold the case C1 of the electronic device again. Therefore, through the power supply control device 30 of the present invention, when the user is not touching the sensing areas A1, A2, the sensing module 100 may generate corresponding determination signals D1, D2, to instruct the power supply module 102. As such, the power supply module 102 may immediately turn off the power of the electronic device 3, for protecting the targeted electronic component for desoldering and the electronic device 3 from heat, and further protect the user from being burned. Therefore, the power supply control device 30 of the present invention may avoid unnecessary power consumption and protect the user.

Figure 4:
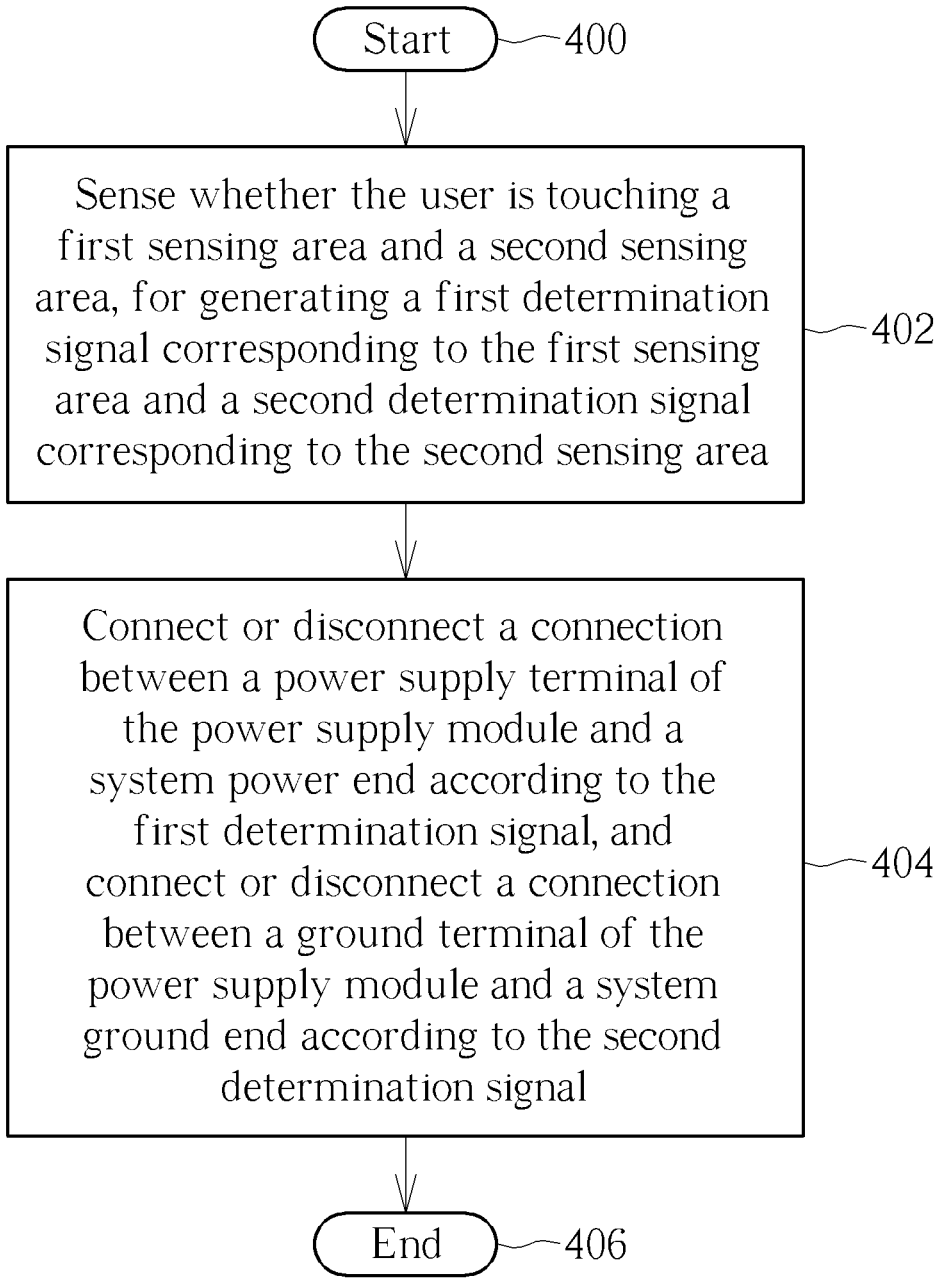
FIG. 4 is a schematic diagram of a process according to an embodiment of the present invention.

The operating procedures of the power supply control devices 10, 20, 30 stated above may be summarized as a process 40. As shown in FIG. 4, the process 40 comprises the following steps:

Step 400: Start.

Step 402: Sense whether the user is touching a first sensing area and a second sensing area, for generating a first determination signal corresponding to the first sensing area and a second determination signal corresponding to the second sensing area.

Step 404: Connect or disconnect a connection between a power supply terminal of the power supply module and a system power end according to the first determination signal, and connect or disconnect a connection between a ground terminal of the power supply module and a system ground end according to the second determination signal.

Step 406: End.

Details of the process 40 may be referred to the paragraph stated in the above, which is not narrated herein.

In the prior art, the user has to manually turn the power of the electronic device on or off, which may not rule out negligence or careless touches of the power by the user, and may result in additional power consumption and safety concerns. The power supply control device of the present invention may sense whether the user is using the electronic device on the sensing area, for accordingly turning the power of the electronic device on or off, so as to avoid unnecessary power consumption and protect the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply control device, applied for an electronic device comprising a case provided for a user to hold and operate the electronic device, the power supply control device comprising:
   a sensing module, disposed on the case, comprising:
      a first sensing component, disposed on a first sensing area of the case, for sensing whether the user is touching the first sensing area, to generate a first determination signal; and
      a second sensing component, disposed on a second sensing area of the case different to the first sensing area, for sensing whether the user is touching the second sensing area, to generate a second determination signal; and
   a power supply module, comprising:
      a first relay, coupled to the first sensing component, a system power end of the electronic device and a power supply terminal, for determining whether to couple the system power end to the power supply terminal according to the first determination signal; and
      a second relay, coupled to the second sensing component, a system ground end of the electronic device and a ground terminal, for determining whether to couple the system ground end to the ground terminal according to the second determination signal.

2. The power supply control device of claim 1, wherein when the first determination signal indicates that the user is touching the first sensing area, the first relay couples the system power end of the electronic device to the power supply terminal; and when the first determination signal indicates that the user is not touching the first sensing area, the first relay does not couple the system power end of the electronic device to the power supply terminal.

3. The power supply control device of claim 1, wherein when the second determination signal indicates that the user is touching the second sensing area, the second relay couples the system ground end of the electronic device to the ground terminal; and when the second determination signal indicates that the user is not touching the second sensing area, the second relay does not couple the system ground end of the electronic device to the ground terminal.

4. The power supply control device of claim 1, wherein the first sensing component is a touch switch, and the first sensing component comprises a first end coupled to a direct-current (DC) voltage and a second end coupled to the first relay; when the user is touching the first sensing area, the first sensing component conducts a connection between the first end and the second end, to deliver the DC voltage to the first relay; and when the user is not touching the first sensing area, the first sensing component does not conduct the connection between the first end and the second end.

5. The power supply control device of claim 1, wherein the second sensing component is a touch switch, the second sensing component comprises a first end coupled to a direct-current (DC) voltage and a second end coupled to the second relay; when the user is touching the second sensing area, the second sensing component conducts a connection between the first end and the second end, to deliver the DC voltage to the second relay; and when the user is not touching the second sensing area, the second sensing component does not conduct the connection between the first end and the second end.

6. The power supply control device of claim 1, wherein the first determination signal and the second determination signal are delivered to the first relay and the second relay through a wireless transmission method.

7. An operating method, applied for an electronic device, wherein a user holds a case of the electronic device to operate the electronic device, the operating method comprising:
sensing whether the user is touching a first sensing area and a second sensing area on the case, to generate a first determination signal corresponding to the first sensing area and a second determination signal corresponding to the second sensing area; and
determining whether to couple a system power end of the electronic device to a power supply terminal according to the first determination signal, and determining whether to couple a system ground end of the electronic device to a ground terminal according to the second determination signal.

8. The operating method of claim 7, further comprising when the first determination signal indicates that the user is holding the case, coupling the system power end of the electronic device to the power supply terminal; and when the first determination signal indicates that the user is not holding the case, not coupling the system power end of the electronic device to the power supply terminal.

9. The operating method of claim 7, further comprising when the second determination signal indicates that the user is holding the case, coupling the system ground end of the electronic device to the ground terminal; and when the second determination signal indicates that the user is not holding the case, not coupling the system ground end of the electronic device to the ground terminal.

10. The operating method of claim 7, further comprising when the user is touching the first sensing area, delivering a direct-current (DC) voltage as the first determination signal; and when the user is not touching the first sensing area, not delivering the DC voltage.

11. The operating method claim 7, further comprising when the user is touching the second sensing area, delivering a direct-current (DC) voltage as the second determination signal; and when the user is not touching the second sensing area, not delivering the DC voltage.

12. The operating method of claim 7, wherein the first determination signal and the second determination signal are delivered through a wireless transmission method.

* * * * *